(12) United States Patent
Preda et al.

(10) Patent No.: US 12,266,598 B2
(45) Date of Patent: Apr. 1, 2025

(54) DENSE VIA PITCH INTERCONNECT TO INCREASE WIRING DENSITY

(71) Applicant: International Business Machines Corporation, Armonk, NY (US)

(72) Inventors: Francesco Preda, New Braunfels, TX (US); Sungjun Chun, Austin, TX (US); Jose A. Hejase, Pflugerville, TX (US); Junyan Tang, Austin, TX (US); Pavel Roy Paladhi, Pflugerville, TX (US); Nam Huu Pham, Round Rock, TX (US); Wiren Dale Becker, Hyde Park, NY (US); Daniel Mark Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 18/049,143

(22) Filed: Oct. 24, 2022

(65) Prior Publication Data

US 2024/0136270 A1   Apr. 25, 2024
US 2024/0234284 A9   Jul. 11, 2024

(51) Int. Cl.
| | |
|---|---|
| H05K 1/02 | (2006.01) |
| H01L 21/48 | (2006.01) |
| H01L 23/498 | (2006.01) |
| H05K 1/11 | (2006.01) |
| H05K 1/18 | (2006.01) |

(52) U.S. Cl.
CPC .... *H01L 23/49838* (2013.01); *H01L 21/4857* (2013.01); *H01L 21/486* (2013.01); *H01L 23/49822* (2013.01); *H05K 1/0228* (2013.01); *H05K 1/0243* (2013.01); *H05K 1/0298* (2013.01); *H05K 1/111* (2013.01); *H05K 1/181* (2013.01); *H05K 1/0237* (2013.01); *H05K 1/0284* (2013.01)

(58) Field of Classification Search
None
See application file for complete search history.

(56) References Cited

U.S. PATENT DOCUMENTS

| | | |
|---|---|---|
| 7,646,082 B2 | 1/2010 | Chun et al. |
| 7,757,196 B2 | 7/2010 | Bird et al. |
| (Continued) | | |

FOREIGN PATENT DOCUMENTS

CN   113573463 A   10/2021

OTHER PUBLICATIONS

China National Intellectual Property Administration, International Search Report and Written Opinion for PCT Application No. PCT/CN2023/125903, dated Jan. 12, 2024.

*Primary Examiner* — Ishwarbhai B Patel
(74) *Attorney, Agent, or Firm* — Patterson + Sheridan, LLP

(57) ABSTRACT

An enhanced integrated circuit interconnect package, method and multiple-layer integrated circuit laminate structure enable increased routing density per layer and maintains signal integrity performance. A differential signal via pair of vertical interconnect vias provide differential signaling. The vias of the differential signal via pair are positioned closely spaced together with each via offset from a center axis of an associated LGA contact, minimizing space between the differential signal vias and maintaining signal integrity performance, and providing increased available wiring signal channel.

20 Claims, 4 Drawing Sheets

(56) References Cited

U.S. PATENT DOCUMENTS

| | | | |
|---|---|---|---|
| 7,821,796 B2 | 10/2010 | Chun et al. | |
| 8,119,931 B1* | 2/2012 | Liu | H05K 1/0245 |
| | | | 174/262 |
| 8,617,990 B2 | 12/2013 | Mallik et al. | |
| 9,137,887 B2 | 9/2015 | Biddle et al. | |
| 9,655,233 B2* | 5/2017 | Nakagawa | H05K 1/0245 |
| 10,958,001 B2 | 3/2021 | Minich | |
| 10,966,311 B2 | 3/2021 | Kim et al. | |
| 2006/0180905 A1* | 8/2006 | Zeng | H01L 23/49822 |
| | | | 257/E23.079 |
| 2007/0230150 A1 | 10/2007 | Castriotta et al. | |
| 2017/0229407 A1 | 8/2017 | Zu et al. | |
| 2019/0159333 A1* | 5/2019 | Sinha | H05K 1/115 |
| 2019/0289710 A1* | 9/2019 | Kumar | G06F 13/4282 |

* cited by examiner

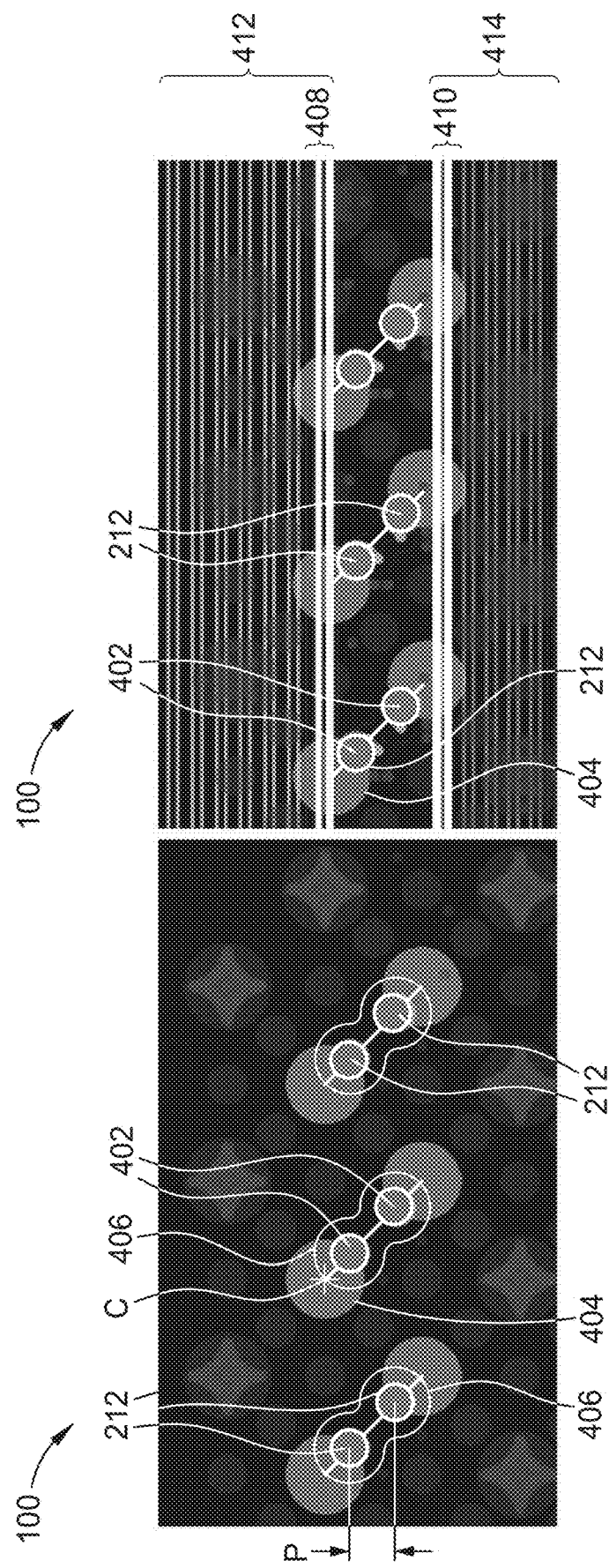

DENSE VIA PITCH INTERCONNECT TO INCREASE WIRING DENSITY

BACKGROUND

The present disclosure relates to integrated circuit packaging designs, and more specifically, to a high-speed differential signal integrated circuit interconnect package and structure connecting a chip/die and a land grid array (LGA) or hybrid land grid array (HLGA) socket connector.

High data-rate and bandwidth integrated circuit interconnect applications typically require differential signal via pairs for high speed differential signaling. Integrated circuit interconnect packages, for example, connecting a chip/die and a land grid array (LGA) or hybrid land grid array (HLGA) socket connector require reliable and effective signal integrity performance with high speed differential signaling.

SUMMARY

Embodiments of the present disclosure are directed to an enhanced integrated circuit interconnect package, method and multiple-layer integrated circuit laminate interconnect structure configured for enabling increased routing density per layer and maintaining signal integrity performance. A non-limiting example multiple-layer integrated circuit structure includes a substrate core, and a plurality of buildup layers above and below the substrate core. A plurality of vertical interconnect vias extend through the substrate core. A differential signal via pair of the vertical interconnect vias provide differential signaling. The differential signal vias of the via pair are positioned together spaced apart with each via offset from a center axis of an associated LGA contact, minimizing space between the pair of vertical interconnect vias and maintaining signal integrity performance, and allowing increased wiring signal channel.

BRIEF DESCRIPTION OF THE DRAWINGS

FIGS. 5A and 5B are respective views of the interconnect substrate structure of the IC interconnect package of FIGS. 1 and 2 illustrating differential signal via pairs of the vertical interconnect vias arranged with a dense via pitch in accordance with disclosed embodiments.

DETAILED DESCRIPTION

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In accordance with a disclosed embodiment, an IC interconnect package 100 includes enhanced placement of differential signal vias of via pairs. A differential signal via pair comprise two differential signal vertical interconnect vias. The vias of the differential signal via pairs are positioned spaced together with each via of said via pair positioned offset from a center axis of an associated LGA contact to which the vias are electrically connected. The placement of the vias of the differential signal via pairs provides a reduced pitch or space between the differential signal vertical interconnect vias over previous arrangements. The reduced via pitch creates additional available wiring channels, while maintaining electrical signal integrity performance. IC interconnect package 100 enables increased routing density per layer, minimizing a required layer count in a buildup layer stack and maintaining signal integrity performance for high speed differential signal pairs.

Figure 1:
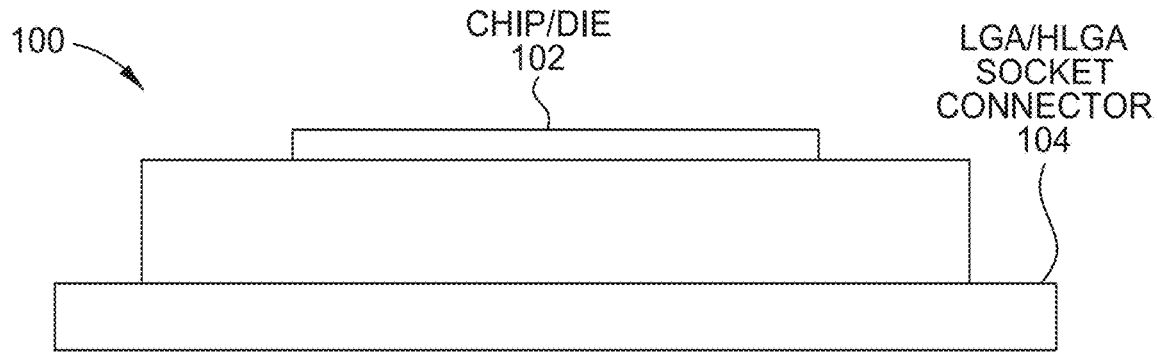
FIG. 1 illustrates an integrated circuit (IC) interconnect package in accordance with one or more disclosed embodiments connecting between a semiconductor chip/die and a land grid array (LGA) or hybrid land grid array (HLGA) socket connector.

With reference now to FIG. 1, there is shown an IC interconnect package 100 in accordance with a disclosed embodiment. As shown, IC interconnect package 100 is connected between a chip/die 102 and a land grid array (LGA) or hybrid land grid array (HLGA) socket connector 104. The chip/die 102 include various complex, high speed integrated circuits requiring for example, a large number of high speed, differential signal connections, electrically connected by solder ball or coined pre-solder site to the IC interconnect package 100. The chip/die 102 can include for example, an application specific integrated circuit (ASIC), a field programmable gate array (FPGA), a central processor unit or processor, and the like. The LGA or HLGA socket connector 104 includes a high-density array of electrically conductive contact members connected by solder balls to the IC interconnect package 100.

The IC interconnect package 100 may be used in a variety of computing systems, such as a server, desktop computer, mobile device, networking device, and the like.

Figure 2:
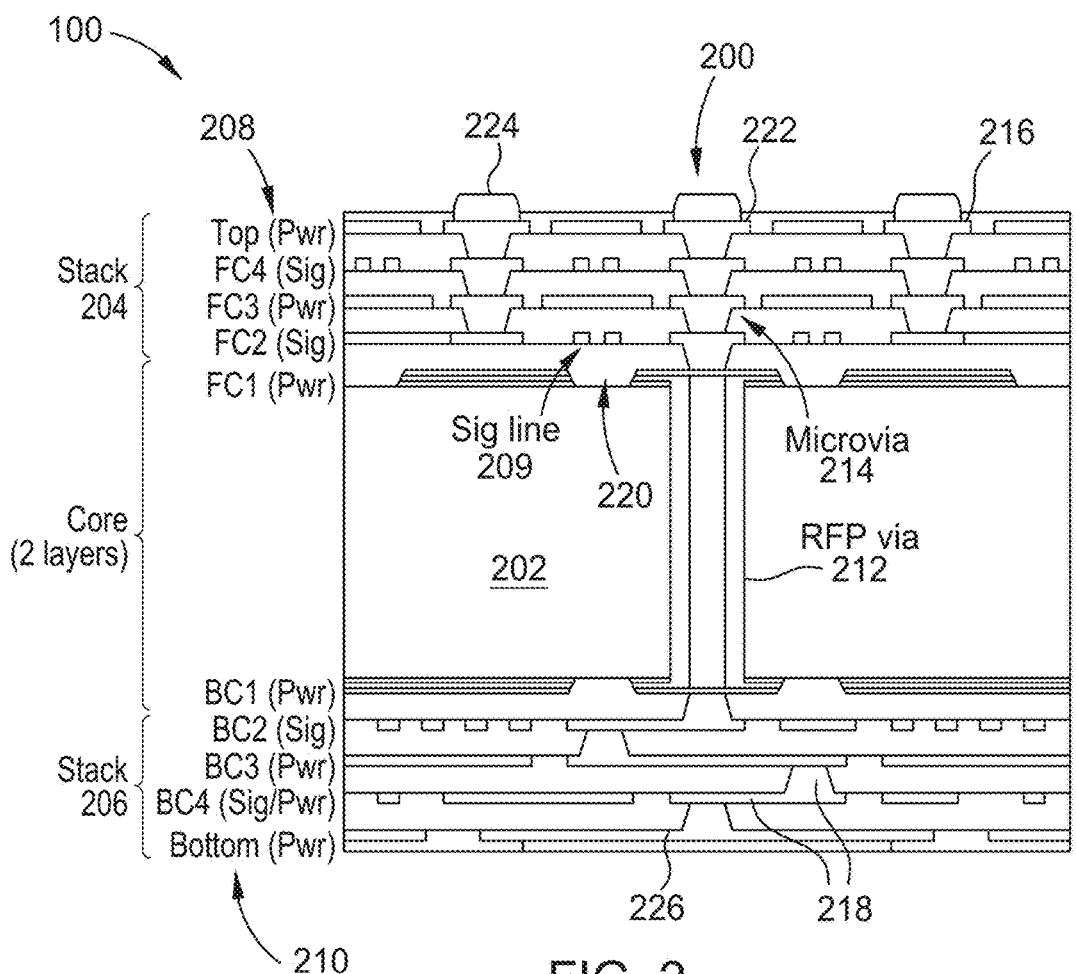
FIG. 2 is a cross-sectional view illustrating an example multiple-layer interconnect substrate structure of the IC interconnect package of FIG. 1 in accordance with a disclosed embodiment.

FIG. 2 is an example cross-sectional view of the IC interconnect package 100 illustrating an example IC interconnect substrate structure 200 in accordance with a disclosed embodiment. IC interconnect structure 200 is a multiple layer laminate structure 200 including a middle substrate core 202. Middle substrate core 202 comprises a front circuit (FC) layer FC1, and a bottom circuit (BC) layer BC1 layer. IC interconnect structure 200 includes front circuit (FC) buildup stack 204 and a corresponding bottom circuit (BC) buildup stack 206. The substrate core 202 can be made of a fiber reinforced organic or resin material. The FC buildup stack 204 and the BC buildup stack 206 include multiple corresponding dielectric reference and signal layers fabricated on respective sides of the substrate core 202. Dielectric layers forming the FC buildup stack 204 and the BC buildup stack 206 include for example, an organic resin material, and/or Ajinomoto buildup film (ABF). The FC buildup stack 204 and the BC buildup stack 206 are built layer by layer on one another on the top and bottom of the substrate core 202 by conventional fabrication process. As shown, FC buildup stack 204 includes four layers 208, FC2, FC3, FC4, Top layer (Pwr). BC buildup stack 206 includes corresponding four buildup layers 210, BC2, BC3, BC4, and Bottom (Pwr). The Top layer (P of FC buildup stack 204 and the Bottom layer of BC buildup stack 206, respectively provide connections to the chip/die 102 and the LGA or HLGA socket connector 104. That is, the chip/die 102 (not shown) is connected to the Top layer while the socket connector 104 (not shown) is connected to the Bottom layer.

Features and advantages of the IC interconnect package 100 of one or more disclosed embodiments advantageously can be implemented with various known IC interconnect packaging technologies and fabrication processes. It should be understood that IC interconnect substrate structure 200 provides only an illustrative example. The multiple layer laminate structure 200 of IC interconnect package 100 can be implemented using various technologies and including various numbers of buildup layers and various numbers of layers forming the substrate core 202.

As shown, respective buildup layers 208, FC2, FC3, FC4, and Top layer and buildup layers 210, BC2, BC3, BC4, and Bottom layer include corresponding layers sequentially formed above and below the substrate core 202. As shown, even numbered buildup layers 208, FC2 and FC4, and layers 210, BC2, BC4 are signal lines (Sig) providing internal signal interconnections typical of interconnections of chip circuitry. Odd numbered buildup layers 208, FC3, and layers 210, BC3 are reference layers associated conductive reference power planes (Pwr) e.g. copper sheets, providing signal path shielding and isolation according to the IC package design. A signal line 209 in the buildup layer 208, FC2 shown in FIG. 2 represents high-density internal signal interconnections.

IC interconnect structure 200 includes a plurality of vertical interconnection vias 212 extending through the substrate core 202, for example Resin Filled Plate (RFP) vias 212 as shown in FIG. 2. A pattern of holes in the substrate core 202 defines RFP vias 212 placement locations. It should be understood that IC interconnect substrate structure 200 and the interconnect vias 212 are not limited to RFP vias 212. Substrate structure 200 and the interconnect vias 212 can be implemented with various other via technologies. For example, other Plated Through Hole (PTH) vias can implement interconnect vias 212.

IC interconnect structure 200 includes a plurality of smaller, micro-vias 214 arranged for interconnecting RFP vias 212 and stack buildup layers 208, 210, such as buildup signal layers 208, FC2 and FC4, and signal layers 210. BC2, BC4, as required by the IC package design. As shown, multiple micro-vias 214 for example, are arranged as stacked micro-vias 216 and jogged micro-vias 218. RFP vias 212 and micro-vias 214 are formed in the IC interconnect substrate structure 200 by known fabrication techniques, optionally including mechanical and/or laser drilling and filling, for example with a resin/conductive electrolytic copper filling.

For example, in IC interconnect substrate structure 200, the core may be in a range between 200 µm to 1500 µm thick, the diameter of the interconnecting RFP vias 212 may be in a range between 120 µm and 500 µm in diameter, while the stack buildup layer micro-vias 214 may be in a range between 40 µm and 70 µm in diameter. The larger diameter RFP vias 212 extending through the core 202 are used due to the relative thickness of the core 202, which makes reliable fabrication and resin/conductive filling of the vias more difficult than for micro-vias 214 between the thin buildup layers that are laminated on the core.

Isolation regions, indicated by reference line 220 in FIG. 2 are defined areas devoid of metal and filled with a dielectric material. Isolation regions 220 are formed in core layers FC1 and BC1. Isolation regions 220 can be further extend to buildup layers 208, and 210, above and below RFP vias 212. Isolation regions 220 are used with the RFP vias 212 to remove the adverse effect of capacitance between RFPs and the core and buildup layers 208, 210 above and below the RFP vias. Isolation regions 220 between RFP vias 212 and the core and buildup layers or planes limit available wiring channels.

Isolation regions 220 in the buildup layers and core layers FC1 and BC1 limit the routing density in the buildup signal layers 208, and buildup signal layers 210, because the isolation regions do not provide proper return paths for signal referencing. The loss of routing density due to isolation regions 220 can cause an increase in the number of required layers. Adding a signal layer and an associated reference layer in organic buildup technology significantly increases cost.

As shown, IC interconnect structure 200 includes a Top layer controlled collapse chip connection pad 222, also called flip chip or C4 contact pad 222, electrically and mechanically connected to a corresponding electrical solder ball or coined pre-solder site 224 connecting to the die/chip 102. IC interconnect structure 200 include a Bottom layer conductive LGA contact 226 electrically and mechanically connected to corresponding LGA connection (not shown) of the LGA/HLGA socket connector 104.

IC interconnect package 100 and IC interconnect structure 200 effectively and efficiently enable high-speed buses using differential signaling for high data-rate and bandwidth applications. In accordance with disclosed embodiments, as shown in FIGS. 5A and 5B, a differential signal pair 402 of differential signal vias 212 are positioned closely spaced together with each via offset from a center axis C of an associated LGA contact 226, minimizing space between the pair of vertical interconnect vias, maintaining signal integrity performance, and providing increased available wiring signal channel.

Figure 3:
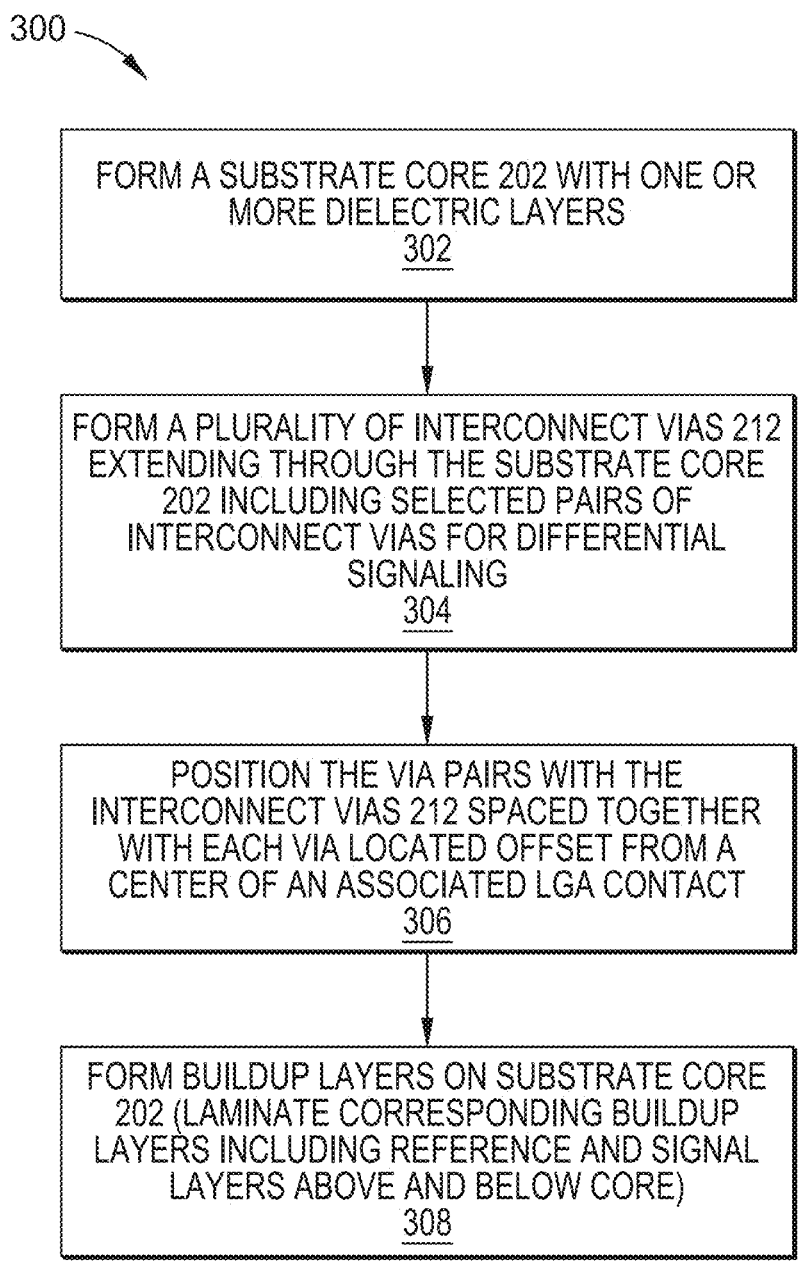
FIG. 3 is a flow chart illustrating example operations of one or more disclosed embodiments.

In accordance with disclosed embodiments, via placement with minimized space between of the differential signal vias 212 of the via pair 402 allows increased wiring signal channel in the buildup layers 208, 210. IC interconnect package 100 and IC interconnect structure 200 provide a package design for differential signaling that achieves required signal integrity performance, providing isolation regions in core layers FC1, BC1 and reference layers over and under signal RFP vias 212 while at the same time maximizing available routing density, resulting in reduced package cost. FIG. 3 illustrates example operations of a method 300 to implement IC interconnect package 100 and IC interconnect structure 200 of one or more disclosed embodiments. Method 300 at block 302, begins with providing a substrate core 202, where core 202 comprises layers FC1, and BC1. Method 300 at block 304, a plurality of vertical interconnect vias 212 are formed, extending through the substrate core 202, with selected multiple via pairs of vertical interconnect vias 212 for differential signaling. As shown at block 306, the vias 212 of the selected differential signal via pairs are selectively positioned, spaced together with each via of the via pair positioned offset from a center axis of an associated LGA contact to which the vias are electrically connected, minimizing the space between the pair of vertical interconnect vias. An example configuration and placement of the interconnect vias and differential signal via pairs of the disclosed embodiments is illustrated in FIGS. 5A and 5B. Method 300 at block 308, a plurality of buildup layers are formed disposed above and below the substrate core, the buildup layers include multiple corresponding dielectric reference and signal layers. For example, at block 308, buildup layers 208, FC2, FC3, FC4, and Top layer, and buildup layers 210, BC2, BC3, BC4, and Bottom layer are fabricated on respective sides of the middle substrate core 202 above and below core layers FC1, and BC1, as shown in FIG. 2.

Figure 4A:
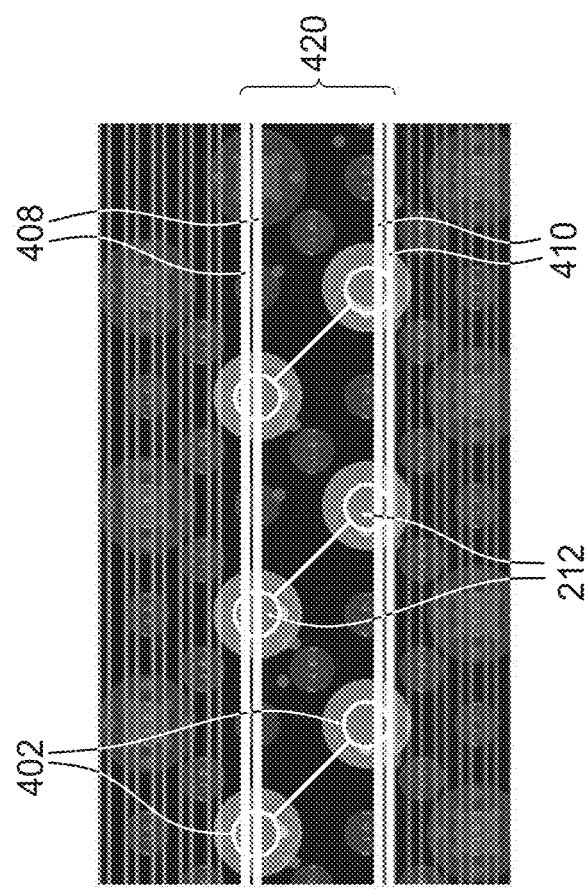
FIGS. 4A and 4B are respective plan views of a conventional interconnect substrate structure with signal via pairs of the vertical interconnect vias of a conventional arrangement for comparison with the arrangement of differential signal via pairs of the vertical interconnect vias arranged in accordance with a disclosed embodiment in FIGS. 5A and 5B.
Figure 4B:
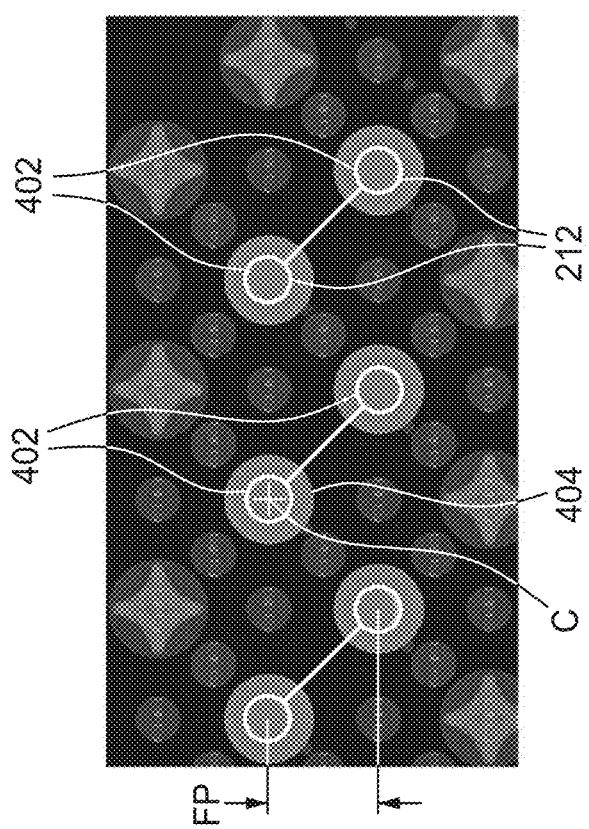

FIGS. 4A and 4B provide respective plan views illustrating a conventional or standard configuration and placement of differential signal via pairs for comparison with corresponding views of the illustrated IC interconnect package 100 and substrate structure 200 in accordance with a disclosed embodiment shown in FIGS. 5A and 5B.

FIGS. 4A and 5A provide a top plan view illustrating the core layer FC1 relative to the bottom LGA layer that provides connections to the associated LGA/HLGA socket connector 104 shown in FIG. 1. FIGS. 4B and 5B provide a top plan view illustrating one of the buildup signal layer 208, FC2 and FC4 overlaying respective core layer 202, FC1 and buildup reference layer 208, FC3, also shown relative to the LGA layer. In FIGS. 3, 4A, 4B, 5A, and 5B, the same reference numbers are used for similar components as used in FIG. 2.

As shown in FIGS. 4A and 4B, the differential signal vias 212 of differential signal via pairs 402 have a standard or full via pitch FP with the RFP vias positioned or co-aligned over the center axis of the associated LGA contact. The standard full RFP via pitch FP has a large space between differential signal RFP vias, reducing remaining available wiring channel and can cause an increase in the number of required layers. Referring also to FIGS. 5A and 5B, the reduced RFP via pitch P of differential signal pair 402 of IC interconnect package 100 and IC interconnect structure 200 provides significantly increased available wiring channel while maintaining required signal integrity performance, As shown in FIG. 4B the illustrated signal lines 408 and 410 with the traditional placement of the differential signal RFP vias cannot be routed, resulting in loss of available wiring channel space, and additional wiring layers can be required. The illustrated traditional signal lines 408, 410 would extend over isolation regions in the buildup reference layer 208, FC3 and core layer FC1. The traditional placement of RFP vias 212 of the via pairs 402 would cause signal integrity performance issues resulting from the loss of a reference return path in the buildup reference layer 208, FC3 and core layer 202, FC1. The required signal integrity performance is maintained with the reduced RFP via pitch P of differential signal pair 402 of the disclosed embodiments as shown in FIGS. 5A and 5B.

As a result of the traditional placement of the differential signal RFP vias, a relatively large area 420 exists between the RFP vias including signal lines 408, 410 where no-wiring is allowed because signal lines 408, 410 cannot be routed in buildup signal layers 208, FC2 and FC4 in FIG. 4B with the traditional configuration. The signal lines 408, 410 shown in FIGS. 5A and 5B are enabled by the dense via pitch P of the disclosed embodiments of IC interconnect package 100 and IC interconnect structure 200.

Referring to FIGS. 5A and 5B, the illustrated configuration and placement of RFP vias 212 in the differential signal via pairs 402 in the IC interconnect package 100 and corresponding IC interconnect substrate structure 200 enable features and advantages in accordance with the disclosed embodiments. IC interconnect package 100 and IC interconnect structure 200 provides enhanced placement of interconnect RFP vias 212 that creates additional available wiring channels, and maintains required signal integrity performance.

FIGS. 5A and 5B illustrate an example enhanced placement of differential signal vias of via pairs 402, such RFP vias 212 (one shown in FIG. 2) arranged in accordance with a disclosed embodiment. The differential signal via pairs 402 comprise two differential signal vertical interconnect RFP vias 212 having a reduced pitch or space between the RFP vias 212, indicated by lines P, and that provide electrical signal integrity performance required for high speed differential signaling. The RFP vias 212 of the differential signal via pairs 402 are positioned closely spaced together with each of the RFP vias 212 positioned offset from a center axis C of an associated LGA contact 404. The placement of the differential signal via pairs 402 reduces the space between RFP vias of differential signal via pairs 402 over previous arrangements such as full pitch FP shown in FIGS. 4A and 4B, providing the dense RFP via pitch P. The dense via pitch P of the differential signal RFP vias 212 is used to create additional available wiring channels, minimizing space between the differential signal interconnect vias 212 of via pairs 402 while maintaining electrical signal integrity performance.

The dense via pitch P of the differential signal vertical interconnect vias 212 is greater than a required minimum manufacturing via pitch between the differential signal RFP vias based on the manufacturing capability for the particular fabrication technology. In IC interconnect package 100, electrical performance for signal integrity demands a larger pitch than the minimum manufacturing pitch for RFP vias 212. The RFP via pitch P of the closely spaced differential signal RFP vias 212 of via pairs 402 is greater than the minimum manufacturing pitch and can be significantly less than the standard pitch FP.

The RFP via pitch P is provided within a defined range enabling minimized space, with effective and reliable signal integrity performance. The RFP via pitch P value is selected in a range based on a particular one of various IC interconnect packaging technologies and fabrication processes implementing the IC interconnect substrate structure 200. In IC interconnect substrate structure 200, for example with a 1200 μm thick core 202, and interconnecting RFP vias 212 having a 200 μm in diameter, the selected RFP via pitch P value may be 500 μm, where a conventional or standard full RFP via pitch may be about 1000 μm. This example is only a conceptual non-limiting example of RFP via pitch P and it should be understood that implementation of IC interconnect package 100 and IC interconnect substrate structure 200 is not limited by this example.

In FIG. 5A, an isolation region 406 is shown in the core layer FC1 over the corresponding LGA layer. Isolation regions 406 formed in the core layers FC1 and BC1, and in respective buildup layers surround via pairs 402 of differential signal vertical interconnect RFP vias 212. Isolation regions 406 appears as a generally 8-shaped void area around the via pair 402 in FIG. 5A.

Isolation regions 406 provided over and under the RFP vias 212 in core layers FC1, BC1 and respective buildup layers substantially reduce or remove adverse effect of capacitive coupling between differential signal pair 402 of RFP vias 212 and the buildup signal layer 208, FC2, FC4, and buildup signal layer 210, BC2, BC4 in planes above and below the interconnect RFP vias.

As shown in FIG. 5B, the dense RFP via pitch P placement creates additional available wiring channels, enabling the respective additional pair of signal lines 408, 410 shown on the buildup signal layers 208. FC2 and FC4. The pair of signal lines 408, 410 on the buildup signal layer 208, FC2, FC4 are spaced apart from isolation region 406 formed in the buildup reference layers enabling an effective reference return path. Increased available wiring channel areas 412, and 414 shown on the buildup signal layer 208, FC2 and FC4 includes the respective additional pair of signal lines 408, 410. The dense RFP via pitch P placement effectively increases available routing density and avoids any signal integrity problem.

It can be seen by comparing the dense RFP via pitch P placement of FIGS. 5A and 5B with the conventional via placement shown in FIGS. 4A and 4B, the full via pitch FP spacing between the differential signal vias is significantly greater than the dense RFP via pitch P placement of the disclosed embodiments. As a result, the relatively large area 420 exists where no-wiring is allowed. i.e., signal lines cannot be routed, in the traditional via placement configuration buildup signal layer 208, FC2 and FC4 in FIG. 4B. The no-wiring area 420 includes the corresponding area of the signal lines 408, 410 shown in FIGS. 5A and 5B, which are enabled with the dense RFP via pitch P placement in accordance with the disclosed embodiments.

IC substrate structure 200 and IC interconnect package 100 provide an enhanced differential signaling configuration for high data-rate and bandwidth applications. The package design and fabrication of IC interconnect package 100 and IC interconnect substrate structure 200 enables differential signaling with the required signal integrity with reduced RFP via pitch P and isolation regions 406 surrounding the RFP vias 212, while at the same time enabling enhanced routing density resulting in reduced package cost.

For example, IC interconnect package 100 and IC interconnect structure 200 can have a reduced RFP via pitch P, such as one-half of a typical full pitch (FP), (as shown in FIGS. 4A and 4B) and provide effective and reliable signal integrity performance. Simulation results for frequency domain and time domain analysis comparing the previous full pitch FP design and a reduced half RFP via pitch P of the disclosed embodiments show very small degradation if any between the RFP half pitch and previous full pitch designs. IC interconnect package 100 and substrate structure 200 with the RFP via pitch P positioning of RFP vias pairs 402 can be utilized generally without concern about signal integrity performance, and as a result gain additional available wiring channel space.

While the foregoing is directed to embodiments of the present invention, other and further embodiments of the invention may be devised without departing from the basic scope thereof, and the scope thereof is determined by the claims that follow.

What is claimed is:

1. An integrated circuit (IC) interconnect package comprising:
   a substrate core;
   a plurality of buildup layers disposed above and below the substrate core, wherein the plurality of buildup layers comprises:
      a top layer disposed above the substrate core, the top layer comprising a plurality of contacts to electrically and mechanically connect to a chip or die;
      a second layer comprising a plurality of signal lines; and
      a bottom layer disposed below the substrate core, the bottom layer comprising a plurality of Land Grid Array (LGA) contacts;
   a plurality of interconnect vias extending vertically through the substrate core, the plurality of interconnect vias connecting the plurality of contacts with the plurality of LGA contacts through a plurality of microvias,
   wherein a differential signal via pair of the plurality of interconnect vias comprises a first via and a second via that are electrically connected to a respective LGA contact of the plurality of LGA contacts, each of the first via and the second via at least partly overlapping with the respective LGA contact and offset inwardly from a center axis of the respective LGA contact, and
   wherein, for each via of the first via and the second via, a respective two or more signal lines of the plurality of signal lines overlap with the respective LGA contact without overlapping the via.

2. The IC interconnect package of claim 1, the plurality of LGA contacts to electrically and mechanically connect to one of a LGA socket connector and a hybrid LGA (HLGA) socket connector.

3. The IC interconnect package of claim 1, further comprising:
   isolation regions devoid of metal surrounding the first via and the second via of the differential signal via pair, the isolation regions formed in core layers surrounding the differential signal via pair.

4. The IC interconnect package of claim 1, wherein the first via and the second via of the differential signal via pair have a selected via pitch P increasing available wiring density, and wherein the selected via pitch P is greater than a minimum manufacturing pitch.

5. The IC interconnect package of claim 4, wherein the substrate core is a dielectric layer containing a pattern of the first via and the second via of the differential signal via pair having the selected via pitch P.

6. The IC interconnect package of claim 1, wherein the plurality of buildup layers disposed above and below the substrate core comprises corresponding layers in a front circuit (FC) buildup stack above the substrate core and a bottom circuit (BC) buildup stack below the substrate core.

7. The IC interconnect package of claim 6, wherein the corresponding layers in the FC buildup stack and the BC buildup stack include at least one signal layer providing internal signal interconnections and an associated reference layer providing signal path shielding and isolation.

8. The IC interconnect package of claim 1, wherein the interconnect vias comprise Resin Filled Plate (RFP) vias.

9. The IC interconnect package of claim 1, wherein the interconnect vias comprise Plated Through Hole (PTH) vias.

10. The IC interconnect package of claim 1,
wherein the plurality of LGA contacts are arranged in a first row and a second row that are staggered with each other,
wherein the first via is electrically connected to a first LGA contact of the first row, and
wherein the second via is electrically connected to a second LGA contact of the second row that is adjacent to the first LGA contact.

11. The IC interconnect package of claim 10,
wherein the respective two or more signal lines, for each of the first via and the second via, are arranged in parallel with the first row and the second row.

12. A system comprising:
a chip or die;
a land grid array (LGA) or hybrid LGA (HLGA) socket connector; and
an interconnect package disposed between the chip or die and the LGA or HLGA socket connector, the interconnect package comprising:
a substrate core;
a plurality of buildup layers disposed above and below the substrate core, wherein the plurality of buildup layers comprises:
a top layer disposed above the substrate core, the top layer comprising a plurality of contacts to electrically and mechanically connect to a chip or die;
a second layer comprising a plurality of signal lines; and
a bottom layer disposed below the substrate core, the bottom layer comprising a plurality of Land Grid Array (LGA) contacts;
a plurality of interconnect vias extending vertically through the substrate core, the plurality of interconnect vias connecting the plurality of contacts with the plurality of LGA contacts through a plurality of micro-vias,
wherein a differential signal via pair of the plurality of interconnect vias comprises a first via and a second via that are electrically connected to a respective LGA contact of the plurality of LGA contacts, each of the first via and the second via at least partly overlapping with the respective LGA contact and offset inwardly from a center axis of the respective LGA contact, and
wherein, for each via of the first via and the second via, a respective two or more signal lines of the plurality of signal lines overlap with the respective LGA contact without overlapping the via.

13. The system of claim 12, the interconnect package further comprising:
isolation regions devoid of metal surrounding the first via and the second via of the differential signal via pair, the isolation regions formed in core layers surrounding the differential signal via pair.

14. The system of claim 12, wherein the first via and the second via of the differential signal via pair have a selected via pitch P increasing available wiring density, and wherein the selected via pitch P is greater than a minimum manufacturing pitch.

15. The system of claim 12, wherein the interconnect vias are Resin Filled Plate (RFP) vias.

16. A method for implementing an integrated circuit (IC) interconnect package, the method comprising:
providing a substrate core;
forming a plurality of interconnect vias extending vertically through the substrate core; and
forming a plurality of buildup layers disposed above and below the substrate core, wherein forming the plurality of buildup layers comprises:
forming a top layer disposed above the substrate core, the top layer comprising a plurality of contacts to electrically and mechanically connect to a chip or die;
forming a second layer comprising a plurality of signal lines; and
forming a bottom layer disposed below the substrate core, the bottom layer comprising a plurality of Land Grid Array (LGA) contacts, wherein the plurality of interconnect vias connect the plurality of contacts with the plurality of LGA contacts through a plurality of micro-vias,
wherein a differential signal via pair of the plurality of interconnect vias comprises a first via and a second via that are electrically connected to a respective LGA contact of the plurality of LGA contacts, each of the first via and the second via at least partly overlapping with the respective LGA contact and offset inwardly from a center axis of the respective LGA contact, and
wherein, for each via of the first via and the second via, a respective two or more signal lines of the plurality of signal lines overlap with the respective LGA contact without overlapping the via.

17. The method of claim 16, wherein the first via and the second via of the differential signal via pair have a selected via pitch P greater than a minimum manufacturing pitch.

18. The method of claim 16, further comprising:
forming isolation regions devoid of metal in core layers surrounding the first via and the second via of the differential signal via pair.

19. The method of claim 16, wherein forming the plurality of buildup layers disposed above and below the substrate core comprises:
forming corresponding layers in a front circuit (FC) buildup stack above the substrate core and a bottom circuit (BC) buildup stack below the substrate core, the corresponding layers including reference layers and signal layers.

20. The method of claim 16, further comprising:
electrically and mechanically connecting the LGA contacts to one of a LGA socket connector and a hybrid LGA (HLGA) socket connector.

* * * * *